(12) United States Patent
Boyd et al.

(10) Patent No.: US 7,777,248 B1
(45) Date of Patent: Aug. 17, 2010

(54) SEMICONDUCTOR DEVICE FOR LATCH-UP PREVENTION

(75) Inventors: Graeme B. Boyd, North Vancouver (CA); Xun Cheng, Chengdu (CN); Ariel D. E. Sibley, Coquitlam (CA)

(73) Assignee: PMC-Sierra, Inc., Santa Clara, CA (US)

( * ) Notice: Subject to any disclaimer, the term of this patent is extended or adjusted under 35 U.S.C. 154(b) by 82 days.

(21) Appl. No.: 12/242,413

(22) Filed: Sep. 30, 2008

(51) Int. Cl.
*H01L 29/74* (2006.01)
(52) U.S. Cl. ............... 257/127; 257/355; 257/E29.255
(58) Field of Classification Search ............... 257/127, 257/355, E29.255
See application file for complete search history.

(56) References Cited

U.S. PATENT DOCUMENTS

| | | |
|---|---|---|
| 5,012,317 A | 4/1991 | Rountre |
| 5,773,335 A | 6/1998 | Chao |
| 5,828,110 A | 10/1998 | Wollesen |
| 6,043,522 A | 3/2000 | Nakajima et al. |
| 6,190,954 B1 | 2/2001 | Lee et al. |
| 6,228,726 B1 | 5/2001 | Liaw |
| 6,236,087 B1 | 5/2001 | Daly et al. |
| 6,614,078 B2 | 9/2003 | Lee et al. |
| 6,621,673 B2 | 9/2003 | Lin et al. |
| 7,019,377 B2 | 3/2006 | Tsuchiko |
| 7,034,363 B2 | 4/2006 | Chen |
| 7,098,509 B2 | 8/2006 | Zdebel et al. |
| 2002/0153570 A1 | 10/2002 | Lin et al. |
| 2007/0057280 A1* | 3/2007 | Hayashi et al. ............. 257/127 |

OTHER PUBLICATIONS

Troutman, Ronald R., "Latchup in CMOS Technology: The Problem and Its Cure," 1986, pp. 7-15, 165-196, Kluwer Academic Publishers, Hingham, MA.

* cited by examiner

*Primary Examiner*—W. David Coleman
(74) *Attorney, Agent, or Firm*—Dennis R. Haszko

(57) ABSTRACT

A semiconductor device is provided for preventing Latch-up in Silicon Controlled Rectifiers (SCRs) when these SCRs become activated. Embodiments of the invention use a natively doped region having high resistance to separate the NPN transistor from the PNP transistor that form the SCR, and/or to isolate the entire SCR from the injector source in order to prevent latch-up. The high resistance of the natively doped region allows to achieve the separation resistance needed in a smaller space, as compared to the space required to achieve the same separation resistance in a well. Accordingly, the invention provides for more robust and cost effective latch-up prevention devices.

36 Claims, 10 Drawing Sheets

US 7,777,248 B1

SEMICONDUCTOR DEVICE FOR LATCH-UP PREVENTION

CROSS REFERENCE TO RELATED APPLICATIONS

This application is related to U.S. patent application Ser. No. 12/242,225 filed on Sep. 30, 2008, and entitled "A SEMICONDUCTOR DEVICE FOR ELECTROSTATIC DISCHARGE PROTECTION" which is incorporated herein by reference in its entirety.

FIELD OF THE INVENTION

The present invention relates generally to semiconductor devices. More particularly, the present invention relates to semiconductor devices for latch-up prevention.

BACKGROUND OF THE INVENTION

Parasitic bipolar transistors of CMOS circuits can form Silicon Controlled Rectifiers (hereinafter referred to as SCRs). An SCR typically includes two parasitic bipolar transistors that are dominantly of opposite connectivity types, such as an NPN parasitic bipolar transistor (hereinafter referred to as NPN) and a PNP parasitic bipolar transistor (hereinafter referred to as PNP). Since the NPN has two junctions of N and one junction of P it is considered to be dominantly an N-type transistor as opposed to the PNP which is considered to be dominantly a P-type transistor. To form an SCR, the collector of the NPN has to be connected to the base of the PNP, and vice versa.

When the SCR becomes activated, the process is known as latch-up. Once the SCR is in the latched state, it may continue to draw high current even if the trigger source is removed. This condition is referred to as sustained latch-up.

When sustained latch-up occurs in a CMOS circuit, the portion of the circuit affected by the latch-up becomes unusable until the power supply is cycled. Cycling the power supply removes the source of the current which sustains the latch-up. However, cycling the power supply causes downtime and needs to be done manually unless latch-up detection circuitry is being used. If the short-circuit current that flows through the SCR is large, physical damage to circuitry may also occur due to the heat generated.

CMOS circuitry is very sensitive to latch-up due to the large number of parasitic SCRs that exist in a chip and the close proximity of the NPN and PNP transistors of the SCR. The latch-up phenomenon may be explained using a simple inverter configuration in a CMOS process. FIG. 1a is a cross section of an inverter 100 including a parasitic SCR device 101. As shown in FIG. 1a, the SCR 101 includes an NPN 102 formed by Nwell 103, P-substrate 104 and N+ diffusion 105, as well as a PNP 106 formed by P+ diffusion 107, Nwell 103 and P-substrate 104. Both bipolar transistors are normally considered to be parasitic but in this context they play an essential role as latch-up forming elements. Between the base and emitter terminals of the NPN and PNP, there are two important resistors (herein referred to as "bypass" resistors): the substrate resistor $R_{SUB}$ and the Nwell resistor $R_{WELL}$. The values of both resistors as well as the gain of both parasitic bipolar transistors determine the latch-up trigger point. FIG. 1b is a circuit schematic showing the SCR device 101 of FIG. 1a connected between $V_{DD}$, $V_{SS}$, and a circuit pad.

FIG. 2 is a graphical representation of a latch-up characteristic curve. The transition from high impedance to negative resistance is at the point where there is sufficient switching current ($I_S$) and switching voltage ($V_S$). This is the trigger point for the latch-up, which is when the SCR activates. The holding point, which occurs at the intersection of holding current ($I_H$) and holding voltage ($V_H$), marks the transition from negative resistance to positive low impedance. If the current and voltage drop below the holding point the SCR will turn off.

The two basic methods for preventing latch-up are: decoupling the parasitic bipolar transistors; and minimizing the bypass resistance. Reducing the bypass resistance reduces the voltage across the internal CMOS structure, thus makes the structure less likely to become latched.

To prevent latch-up from occurring, one approach is to eliminate the gain of the lateral NPN 102 and/or the vertical PNP 106. The standard method of eliminating the gain is to add proper guard rings and/or to maintain sufficient space between the NPN and PNP.

Furthermore, a parasitic SCR that is near an injector is at risk of entering latch-up. The injector is a diffusion that is capable of passing stray carriers into the substrate when voltages go out of their normal ranges. Parasitic SCRs that are not near an injector have a very low probability of entering latch-up because of the absence of a stray current that causes the necessary voltage drop that activates the SCR. Thus, another method of preventing latch-up is to physically separate the entire SCR from the injector.

FIG. 3 is top view of a typical prior art device 300 for latch-up prevention using guard rings between NPN and PNP transistors of an SCR. As shown in FIG. 3, an N+ region 301 is formed in Pwell 302, and a P+ region 303 is formed in Nwell 304. The N+ region 301 defines an NPN transistor 305 with Pwell 302, and the P+ region 303 defines a PNP transistor 306 with Nwell 304. The NPN 305 is surrounded with a P+ guard ring 307. The PNP 306 is surrounded with an N+ guard ring 308. In operation, the P+ guard ring 307 is connected to the lowest voltage rail $V_{SS}$ with a low impedance connection, while the N+ guard ring 308 is connected to the highest positive rail potential $V_{DD}$ used by the devices in the Nwell 308 with a low impedance connection. There are many subtle variations of this concept, an example of which is described in U.S. Pat. No. 6,614,078.

FIG. 4a is a cross sectional view of another prior art device 400 for latch-up prevention using space between the NPN and PNP transistors of the SCR in order to achieve additional latch-up robustness. The device 400 includes an Nwell 401, a Pwell 402, and a P-substrate 403. Nwell 401 includes two P+ diffusions 404 and 405, and an N+ diffusion 406. Pwell 402 includes two N+ diffusions 407 and 408 and a P+ diffusion 409. P+ diffusion 404 of Nwell 401 forms PNP 410 with Nwell 401 and Pwell 402. N+ diffusion 407 forms an NPN 411 with Pwell 402 and Nwell 401. PNP 410 and NPN 411 form the SCR 412. N+ diffusion 408 of Pwell 402 and P+ diffusion 405 of Nwell 401 are latch-up injectors. If the PNP 410 is activated such as through a voltage overshoot at the pad node, current in $R_{PW3}$ raises the potential of Pwell 402, which could activate the NPN 411. Pwell 402 is electrically connected to P-substrate 403, and both are considered as the same terminal. However, the potential of Pwell 402 is more important than that of P-substrate 403, in that the Pwell 402 forms the junction that activates the NPN 411 when it becomes forward biased.

If the NPN 411 is activated, and draws enough current such that it can keep the PNP 410 activated, sustained latch-up occurs. An additional P+ diffusion 413 is added in Pwell 402 between P+ diffusion 409 of Pwell 402 and N+ diffusion 406 of Nwell 401, at a distance D1 of P+ diffusion 409. The distance D1 that separates P+ diffusions 409 and 413 creates a separation resistance $R_{SEP}$ between P+ diffusions 409 and 413. The separation between P+ diffusion 413 and Nwell 401 creates a resistance $R_{PW1}$. Furthermore, a resistance $R_{PW2}$ exists between P+ diffusion 413 and Pwell 402, and a similar resistance $R_{PW3}$ exists between P+ diffusion 409 and Pwell 402. The configuration of these resistances is illustrated in FIG. 4b.

FIG. 4b is a circuit schematic showing the SCR of FIG. 4a connected between $V_{DD}$ and $V_{SS}$. The separation resistance $R_{SEP}$ helps the flow of additional current into $R_{PW2}$, which reduces the current flowing in $R_{PW3}$. Less current in $R_{PW3}$ reduces the Pwell 402 potential around the NPN device, thus reducing the risk of reaching a sufficient $V_{BE}$ to activate the NPN.

Several of the methods discussed above require certain process options to be available. Since such options may increase the cost of fabrication or may simply not be available, these methods are not always practical. Furthermore, as the current technology aims to reduce the size of integrated circuit chips, the area consumed by guard rings and space regions affects the overall cost of producing the chip.

Therefore, it is desirable to find a new method for protecting circuits against latch-up which allows for reduced area consumption and which does not require additional process steps.

SUMMARY OF THE INVENTION

It is an object of the present invention to improve the performance of latch-up prevention devices while reducing their size, which provides for more robust and cost effective devices.

Embodiments of the invention utilize a natively doped region to separate an NPN from a PNP in an SCR, or to separate an SCR from an injector region. The natively doped region is a region that does not have any wells formed therein, and has the same connectivity type and substantially the same doping profile as the substrate. This region has high resistance, and is able to achieve the separation resistance with a relatively smaller area as compared to the wells. The resistance ratio between the substrate and the wells is about 10 times or greater. The higher the resistance of the substrate, the less area is required to achieve the separation resistance.

In an aspect, the present invention provides a semiconductor latch up prevention device comprising a substrate, first and second wells formed in the substrate, an injector region formed in the first well, and an SCR formed in the second well. The SCR includes at least first and second parasitic bipolar transistors dominantly of opposite connectivity types. The latch-up prevention device also comprises a natively doped region provided between the SCR and the injector region, and a guard ring formed in the first well between the injector region and natively doped region. The injector region includes at least one injector. The natively doped region has a resistance at least about 10 times higher than a resistance of the first well. The substrate, the first and second wells, and the natively doped region are of the same connectivity type. The substrate and the natively doped region have substantially the same doping.

The natively doped region can be an epitaxial layer, and can be formed of one or more strips. The resistance of the natively doped region can be in the range of about 10 to about 100 times higher than the resistance of the first well. In an embodiment, the resistance of the natively doped region is more than 100 times higher than the resistance of the first well.

In an embodiment, the natively doped region surrounds the injector region, the first well, and the guard ring. A third well of the first connectivity type that is electrically connected to the first well can be provided between the guard ring and the natively doped region. In another embodiment, the natively doped region surrounds the second well and the SCR.

In another aspect, the invention provides a semiconductor latch up prevention device comprising, a substrate, first and second wells formed in the substrate, an injector region formed in the first well, and a first guard ring provided in the first well adjacent the injector region. The injector region includes at least one injector. The semiconductor latch up prevention device also comprises a first parasitic bipolar transistor dominantly of the first connectivity type formed in the second well, a second guard ring formed in the second well adjacent the first parasitic bipolar transistor, and a natively doped region provided between the second guard rind and the first well. The natively doped region has a resistance at least about 10 times higher than a resistance of the first and the second wells. A second parasitic bipolar transistor is formed in the first well. The second parasitic bipolar transistor is dominantly of a second connectivity type so as to form an SCR with the first parasitic bipolar transistor.

A third guard ring is formed in the first well between the natively doped region and the second parasitic bipolar transistor. The substrate, the first and second wells, and the natively doped region are of the same connectivity type, and the substrate and the natively doped region have substantially the same doping. The first parasitic bipolar transistor is provided in between the second parasitic bipolar transistor and the injector region. The natively doped region surrounds the first parasitic bipolar transistor, the second well and the second guard ring so as to concurrently isolate the first parasitic bipolar transistor, the second well and the second guard ring from the second parasitic bipolar transistor and from the injector region.

In an embodiment, the first parasitic bipolar transistor is dominantly P-type and the second parasitic bipolar transistor is dominantly N-type. In another embodiment, the first parasitic bipolar transistor is dominantly N-type and the second parasitic bipolar transistor is dominantly P-type.

In an embodiment, the connectivity type of the substrate, the wells and the natively doped region is P-type. In another embodiment, the connectivity type of the substrate, the wells and the natively doped region is N-type.

In another aspect, the invention provides a semiconductor latch up prevention device comprising a substrate of a first connectivity type and a first well of a second connectivity type formed in the substrate. The first well includes at least a first implanted region of the first connectivity type and a second implanted region of the second connectivity type. The implanted regions of the first well are arranged for connection to a first polarity rail. The semiconductor latch up prevention device further comprises a second well of the first connectivity type formed in the substrate including a third implanted region of the first connectivity type, and a third well of the first connectivity type formed in the substrate. The second and third wells are electrically connected to the substrate and form one terminal therewith. The third well includes at least a fourth implanted region of the first connectivity type and a fifth implanted region of the second connectivity type. A natively doped region is provided between the second and third wells. The natively doped region has a resistance that is at least about 10 times higher than the second and third wells. The implanted regions of the first well are arranged for connection to a second polarity rail.

The first implanted region forms a first parasitic bipolar transistor dominantly of the first connectivity type with the first well and the second well, and the fifth implanted region forming a second parasitic bipolar transistor dominantly of the second connectivity type with the first well and the third well. The natively doped region creates a separation resistance that helps the current received upon activation of the first parasitic bipolar transistor to flow through the third implanted region of the second well away from the second parasitic bipolar transistor in order to avoid latch up.

The natively doped region can be an epitaxial layer, and can be formed of one or more strips. In an embodiment, the natively doped region is provided in the form of a ring that surrounds the first and the second wells. In another embodiment, the natively doped region is provided in the form of a ring that surrounds the third well. In a further embodiment, the natively doped region is provided in the form of two rings, one ring that surrounds the first and second wells, and one ring that surrounds the third well. In yet another embodiment, the natively doped region is provided in the form of partial rings around at least one of: the first and second wells, and the third well. The resistance of the natively doped region can be in the range of about 10 to about 100 times higher than the resistance of the second and third wells. In an embodiment, the resistance of the natively doped region is more than 100 times higher than the resistance of the second and third wells.

The first well can include a sixth implanted region of the first connectivity type, and the third well can include a seventh implanted region of the second connectivity type. The sixth and the seventh implanted regions are arranged for connection to a circuit pad.

In an embodiment of the invention, the first and the fifth implanted regions are diffusions. The third and the fourth implanted regions can be used as guard rings.

In an embodiment of the invention, the first connectivity type is P-type and the second connectivity type is N-type. In which case, the first polarity rail is a positive power rail, and the second polarity rail is a negative power rail.

In another embodiment, the first connectivity type is N-type and the second connectivity type is P-type. In which case, the first polarity rail is a negative power rail, and the second polarity rail is a positive power rail.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein:

FIG. 5c is a cross sectional view of another embodiment of the latch-up prevention device of FIG. 5a;

FIG. 5d is a cross sectional view of a further embodiment of the latch-up prevention device of FIG. 5a;

FIG. 5e is a cross sectional view of yet another embodiment of the latch-up prevention device of FIG. 5a;

FIG. 6b is a top view of another embodiment of the latch-up prevention device of FIG. 6a;

FIG. 7 is a top view of a latch-up prevention device in which the natively doped region surrounds the SCR instead of surrounding the injector region as in FIG. 6a;

FIG. 8b is a top view of another embodiment of the latch-up prevention device illustrated in FIG. 8a.

DETAILED DESCRIPTION

Generally, the present invention provides a method and system for improving the efficiency of semiconductor devices that prevent latch-up in SCRs, by providing more efficient guard rings and spacing without increasing the size of the latch-up prevention device.

Embodiments of the invention provide a semiconductor device for preventing latch-up in SCRs when these SCRs become activated. A natively doped region having high resistance is used to separate an NPN transistor from a PNP transistor in the SCR, and/or to isolate the entire SCR from the injector source in order to prevent latch-up. The high resistance of the natively doped region allows the device to achieve the separation resistance needed in a smaller space, as compared to the space required to achieve the same separation resistance in a well. Accordingly, more robust and cost effective latch-up prevention devices are provided.

In order to decrease the area of the latch-up prevention device, embodiments of the present invention utilize a natively doped region. The natively doped region has a lower concentration of implanted donor/acceptor atoms, thus has higher resistance as compared to the wells. The ratio of the resistance of the natively doped region to the resistance the wells can be at least about 10 times higher. In an embodiment, it can be from about 10 times to about 100 times higher. In a further embodiment, the ratio can be at least about 100 times higher. The absolute resistance values do not matter as long as the relative values are within one or more of these ranges.

In an embodiment of the invention, an epitaxial (epi) layer or region is provided on top of the substrate. The doping profile of the epi region can be the same as the doping profile of the substrate, or may be different. Hence, it is possible to form the wells in the epi region provided on top of the substrate. The wells can be provided all the way through the depth of the epi region or partially therein. Hence, in the case where epi is used, it is possible to use a natively doped epi to separate the SCR from the injector region, or separate the parasitic bipolar transistors forming the SCR.

The impedance increase can be observed over a wide range of frequencies from DC up to the GHz range. DC is the important frequency for latch-up protection since latch-up is essentially a DC event.

Figure 1A:
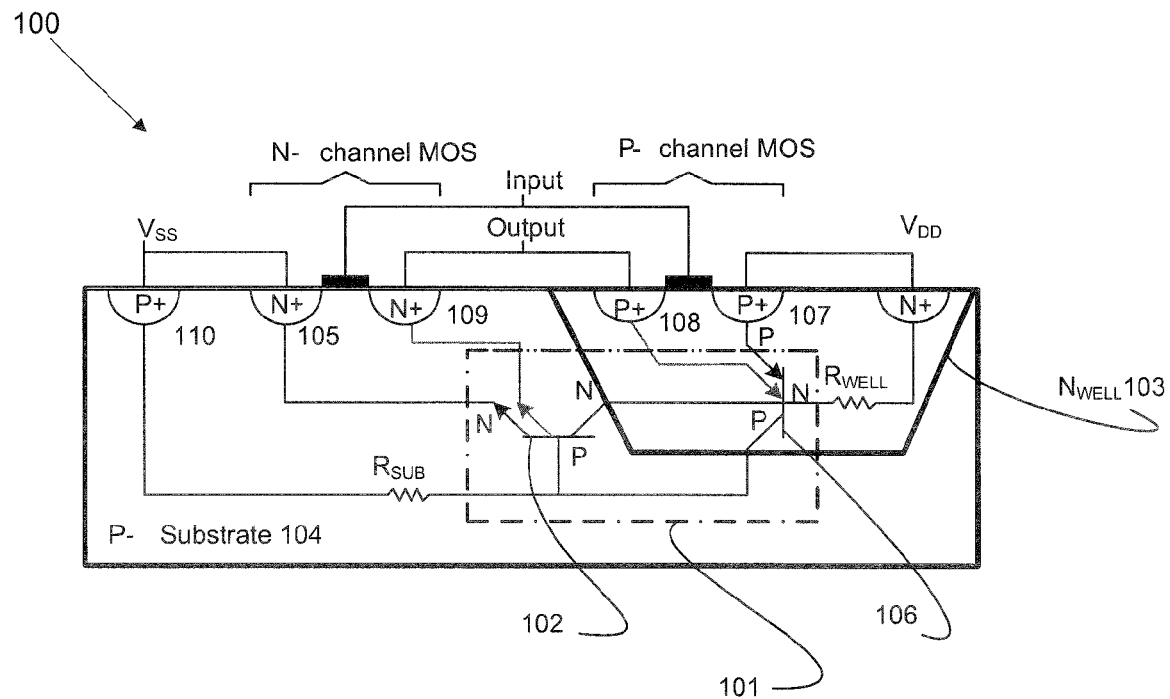
FIG. 1a is a cross sectional view of an inverter including a parasitic SCR device.
Figure 1B:
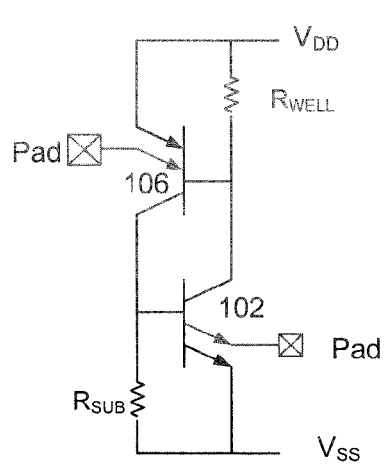
FIG. 1b is a circuit schematic showing the SCR device of FIG. 1 connected between $V_{DD}$, $V_{SS}$ and a circuit pad.
Figure 2:
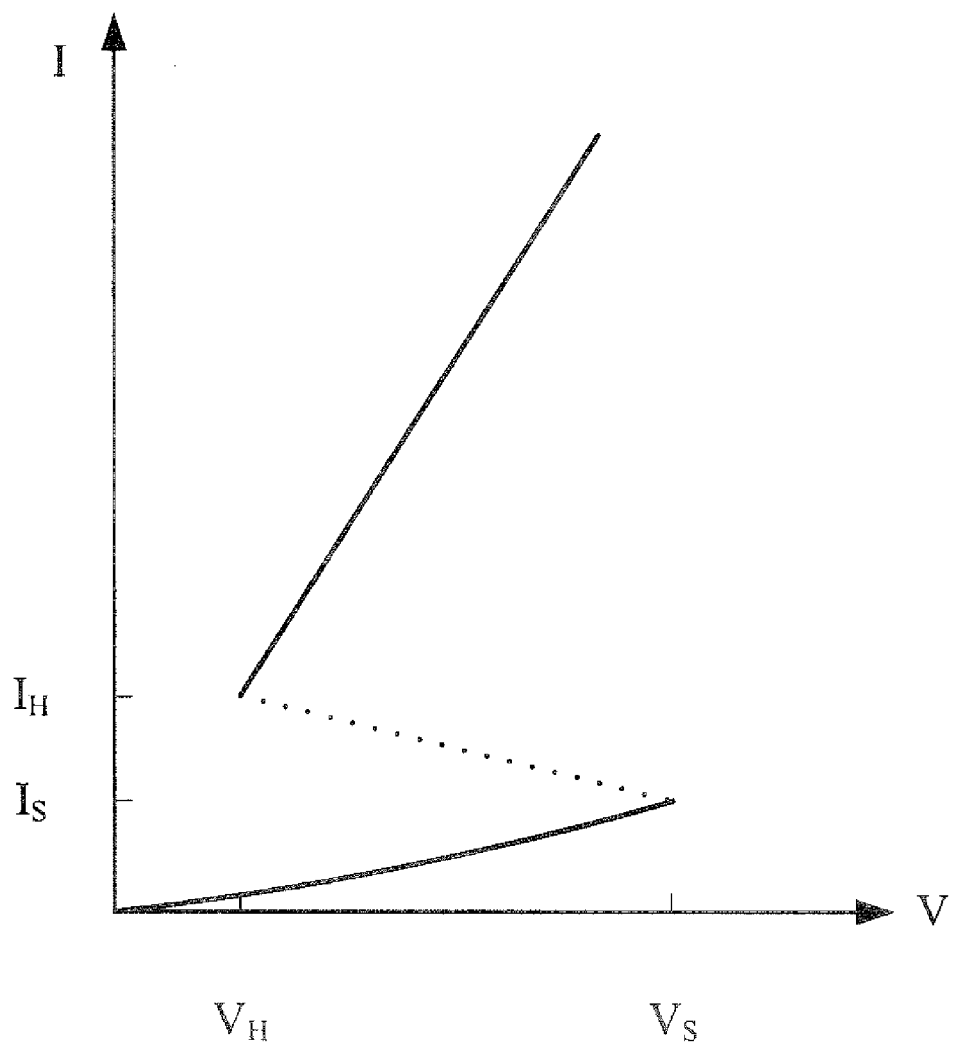
FIG. 2 is a graphical representation of a latch-up characteristic curve.
Figure 3:
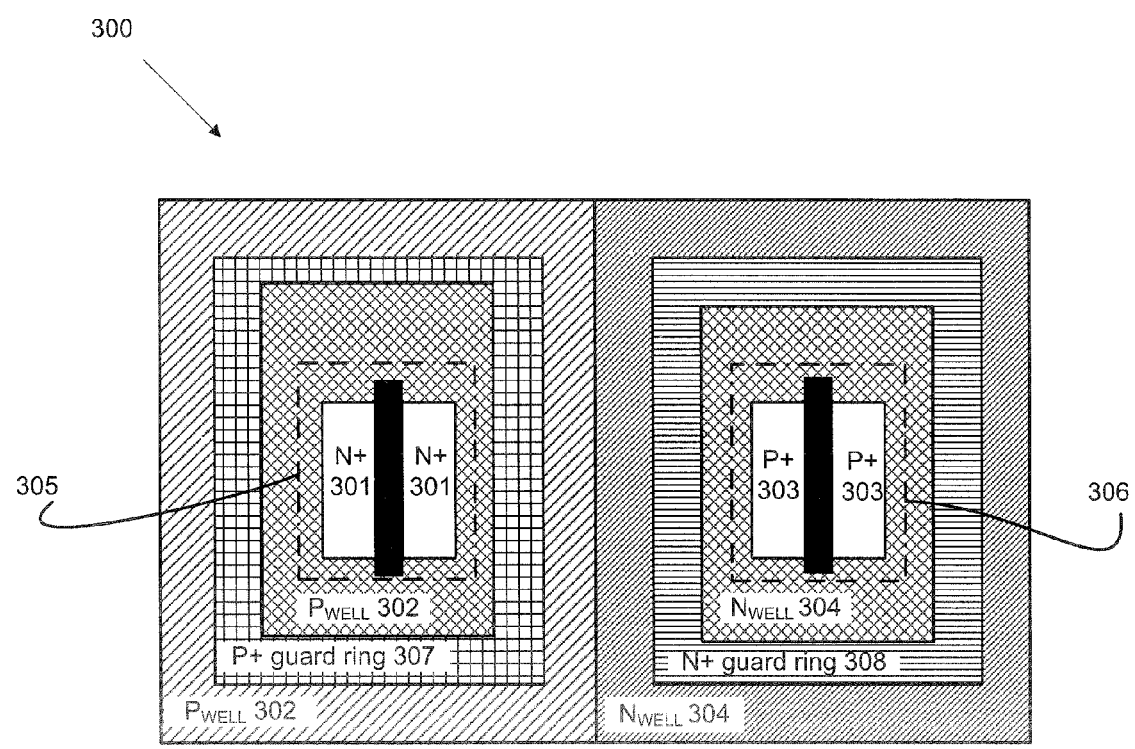
FIG. 3 is top view of a prior art device for latch-up prevention using guard rings between the NPN and PNP transistors of the SCR.
Figure 4A:
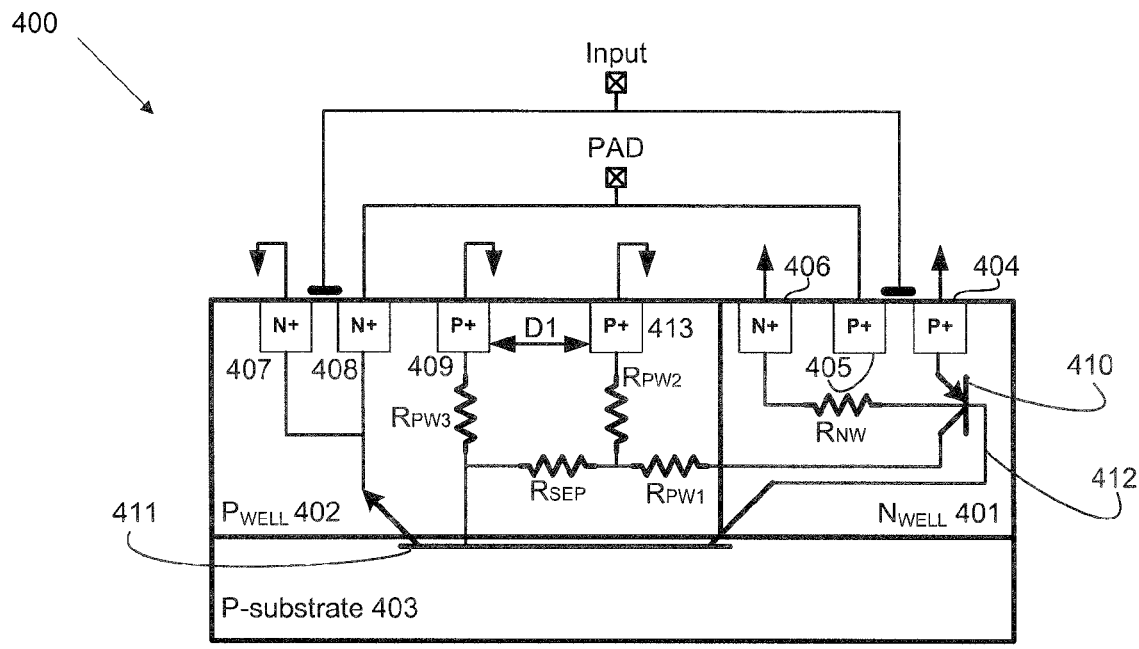
FIG. 4a is a cross sectional view of another prior art device for latch-up prevention using space between the NPN and PNP transistors of the SCR.
Figure 4B:
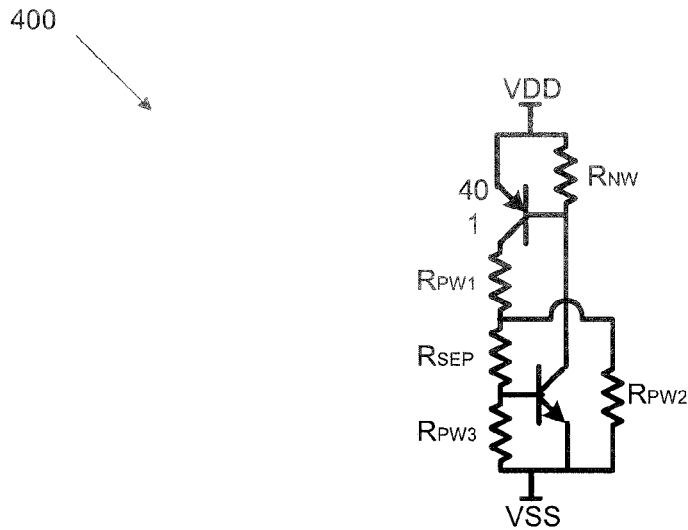
FIG. 4b is a circuit schematic showing the SCR device of FIG. 4a connected between $V_{DD}$ and $V_{SS}$.

As shown in FIG. 4a, prior devices for latch-up prevention using the spacing method include an additional P+ diffusion 413 in the Pwell 402 separated from the P+ diffusion 409 by a distance D1 which adds to the circuit a separation resistance $R_{SEP}$ that decreases the Pwell 402 potential around the NPN device, and reduces the risk of reaching a sufficient $V_{BE}$ to activate the NPN. In order to achieve the desired resistance $R_{SEP}$ a large area of the device is needed for the spacing D1 between the two diffusions, which increases the size of the device for latch-up prevention.

Figure 5A:
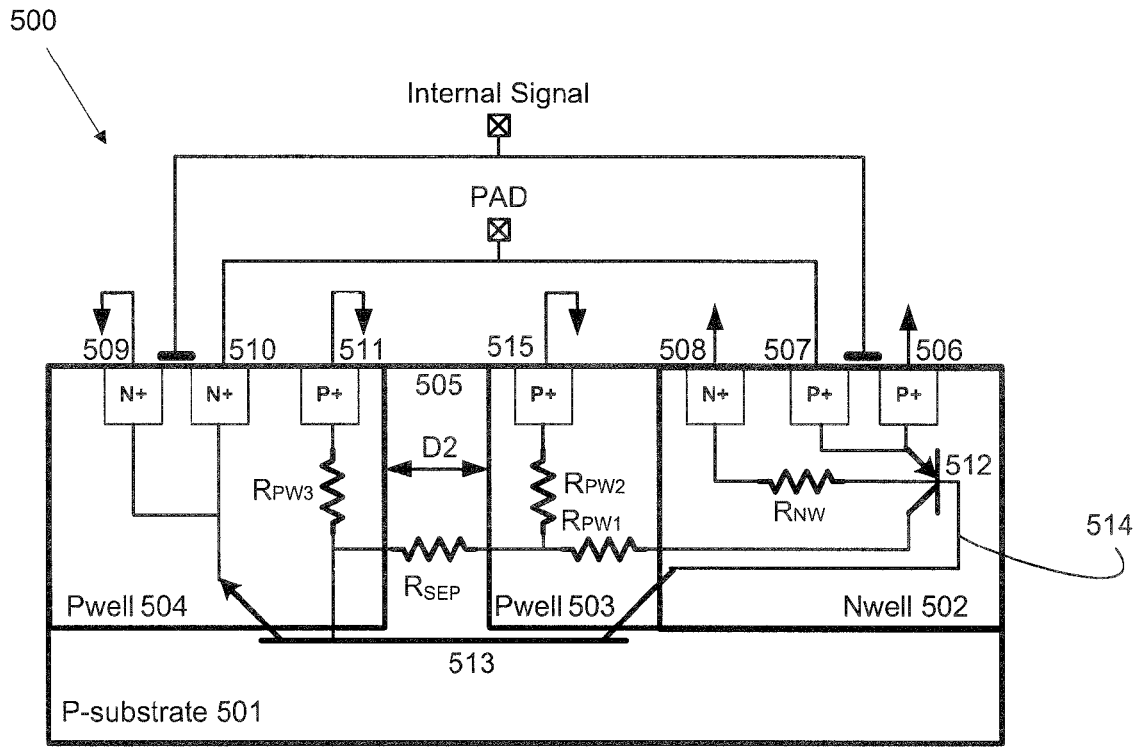
FIG. 5a is a cross sectional view of a latch-up prevention device in accordance with an embodiment of the invention.
Figure 5B:
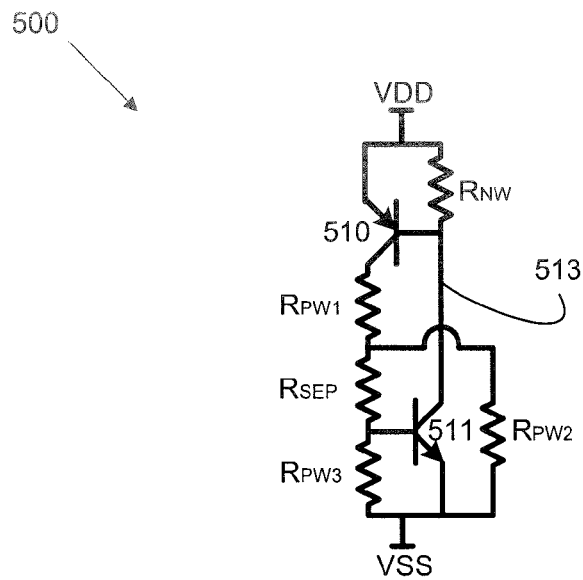
FIG. 5b is a circuit schematic showing the device of FIG. 5a connected between $V_{DD}$ and $V_{SS}$.

FIG. 5a is a cross sectional view of a latch-up prevention device 500 in accordance with an embodiment of the invention, using the spacing method between the NPN and PNP of the SCR. FIG. 5b is a circuit schematic showing the device 500 of FIG. 5a connected between $V_{DD}$ and $V_{SS}$. The device 500 includes a P-substrate 501, an Nwell 502, a Pwell 503 adjacent Nwell 502 and another Pwell 504 separated from Pwell 503 by a natively doped region 505 having high resistance.

Nwell 502 includes two P+ diffusions 506 and 507, and an N+ guard ring 508. Pwell 504 includes two N+ diffusions 509 and 510, and a P+ guard ring 511. P+ diffusion 506 forms PNP 512 with Nwell 502 and Pwell 503. N+ diffusion 509 forms an NPN 513 with Nwell 502 and Pwell 504. PNP 512 and NPN 513 form an SCR 514. Pwell 503 includes a P+ guard ring 515. Pwells 503 and 504 are electrically connected to the P-substrate 501. In other words, although the doping differs between Pwell 503, Pwell 504 and P-substrate 501, the three regions are considered one terminal.

N+ diffusion 510 of Pwell 504 and P+ diffusion 507 of Nwell 502 are latch-up injectors. In operation, N+ diffusion 509 of Pwell 504 is connected to $V_{SS}$, and P+ diffusion 506 of Nwell 502 is connected to $V_{DD}$.

The natively doped region 505 is of the same material as the natively doped substrate 501 and has substantially the same resistance value. The resistance of the natively doped region is high as compared to the low resistance of the wells. For example, the ratio of resistance of the natively doped region to the wells can be at least about 10 times higher. In an embodiment, it can be from about 10 times to about 100 times higher. In a further embodiment, the ratio can be at least about 100 times higher. The absolute resistance values do not matter as long as the relative values are within one or more of these ranges.

The natively doped region 505 acts as a resistor $R_{SEP}$ between guard rings 511 and 515. Since the natively doped region 505 has a higher resistance than the Pwells and the Nwell, it is possible to achieve the desired resistance with a smaller distance D2, as compared to the space D1 needed to achieve the same resistance in a Pwell or Nwell as shown in FIG. 4a. Neglecting the parallel current path through P-substrate 501, the ratio between D2 and D1 is proportional to the resistance ratio between the natively doped region 505 and the wells. In an embodiment, the resistance ratio between the natively doped region 505 and the wells can be from about 10 times to about 100 times higher. In a further embodiment, the ratio can be at least about 100 times higher. Accordingly, the limitation of the prior devices can be overcome and the latch-up robustness can be improved without increasing the size of the latch-up prevention device.

When in operation, P+ guard rings 511 and 515 are connected to $V_{SS}$, while N+ guard ring 508 is connected to $V_{DD}$. Pwell 503 forms a resistance $R_{PW1}$ with Nwell 502, and a resistance $R_{PW2}$ with guard ring 515. Pwell 504 forms a resistance $R_{PW3}$ with guard ring 511. Nwell 502 forms a resistance $R_{NW}$ with N+ guard ring 508. The configuration of the resistances $R_{NW}$ $R_{PW1}$, $R_{PW2}$, $R_{PW3}$, and $R_{SEP}$ with PNP 512 and NPN 513 is illustrated in FIG. 5b. If the PNP 512 becomes activated due to voltage drop in Nwell 502 from current injection, the current flows through resistance $R_{PW1}$ and then divides between the relatively low resistance $R_{PW2}$ to the P+ guard ring around the Nwell and the comparatively high $R_{SEP}$ plus $R_{PW3}$ path to the P+ guard ring 515.

The natively doped region 505 can be used in addition to or instead of the well spacing used in the prior art. Since the natively doped region 505 has a higher resistance relative to the wells, it allows for the spacing D2 to be reduced while maintaining the same latch-up robustness.

Figure 5C:
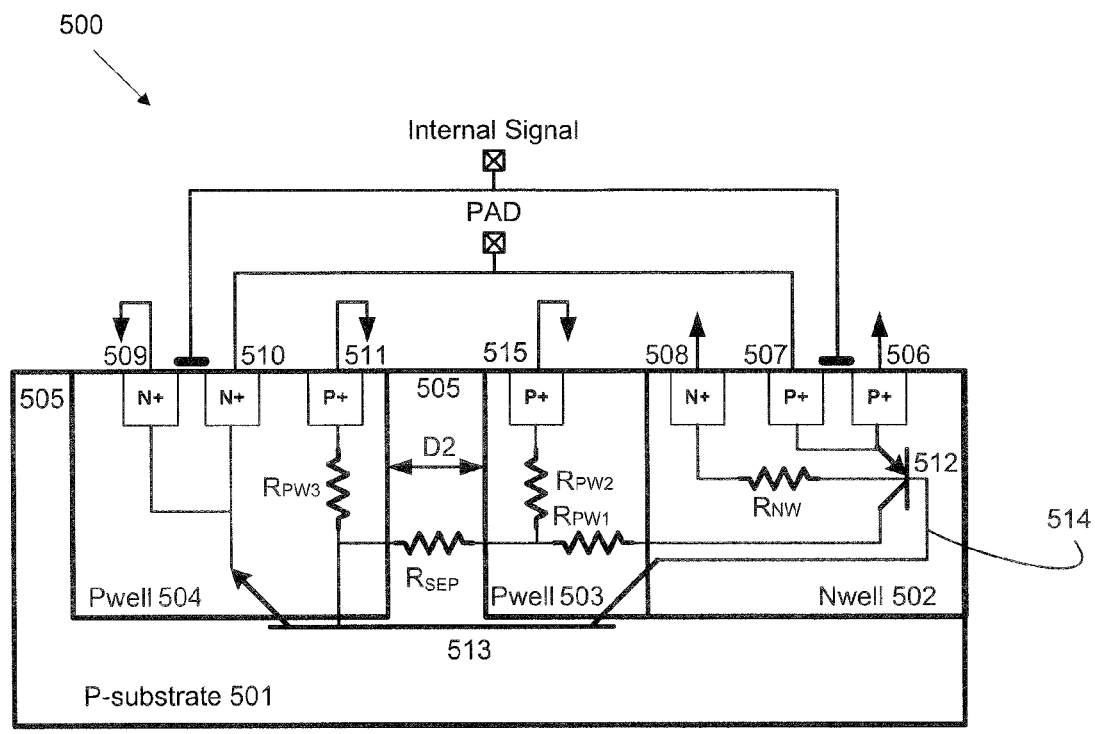
Figure 5D:
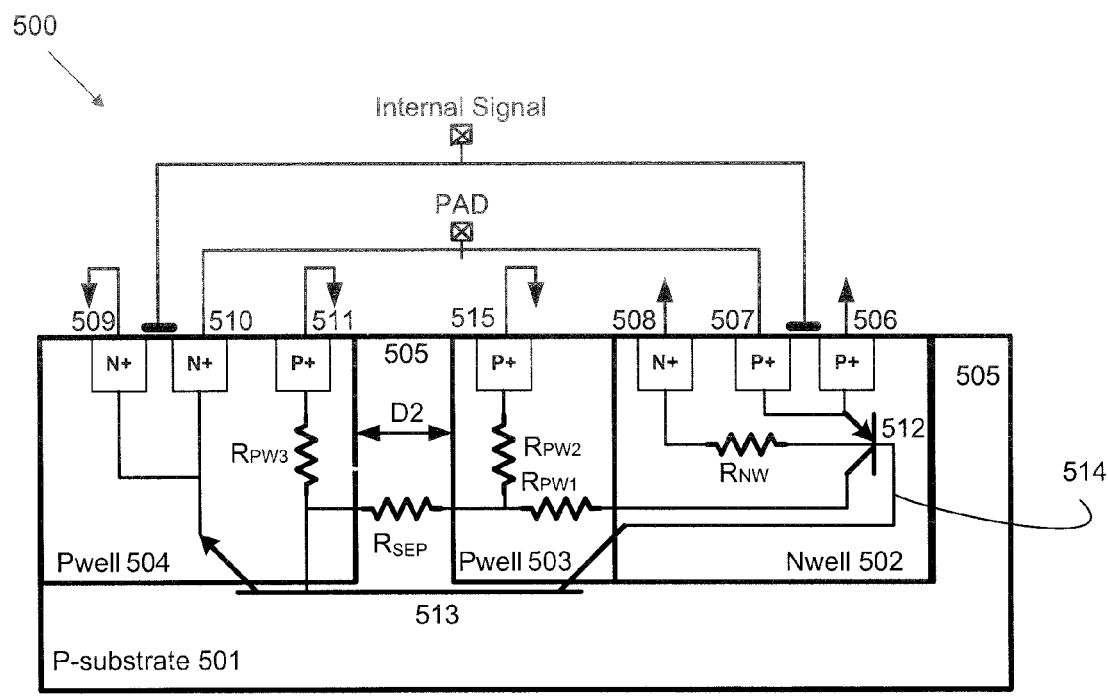
Figure 5E:
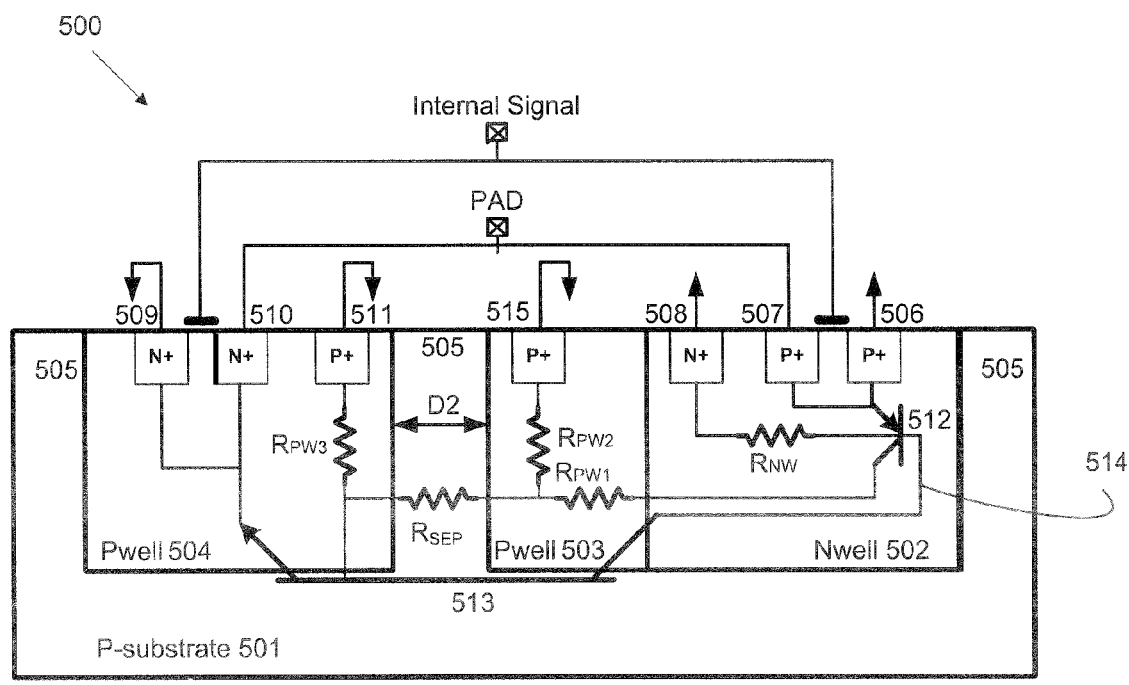

Although the natively doped region 505 is illustrated in FIG. 5a as a strip between Pwells 503 and 504, the natively doped region 505 can also be provided in the form of a ring that surrounds Pwell 504, as illustrated in FIG. 5c. FIG. 5d illustrates a further embodiment of the latch-up prevention device 500 in which, the natively doped region is provided in the form of a ring that surrounds Nwell 502 and Pwell 503. FIG. 5e illustrates a further embodiment of the invention in which, the natively doped region 505 may be provided in the form of two rings, one ring that surrounds Pwell 504, and another ring that surrounds Pwell 503 and Nwell 502.

Generally, P+ diffusion 506, and N+ guard ring 508 of Nwell 502 are connected to a first power rail having a first polarity, and P+ guard ring 515 of Pwell 503, P+ guard ring 511 and N+ diffusion 509 of Pwell 504 are connected to a second power rail having a second polarity, opposite the first polarity. If the substrate 501 is a P-doped substrate, as in the embodiments of FIGS. 5a to 5e, the power rail having the first polarity will be a positive power rail, and the power rail having the second polarity will be a negative power rail. In contrast, if the substrate 501 is an N-doped substrate, the power rail having the first polarity will be a negative power rail, and the power rail having the second polarity will be a positive power rail.

Figure 6A:
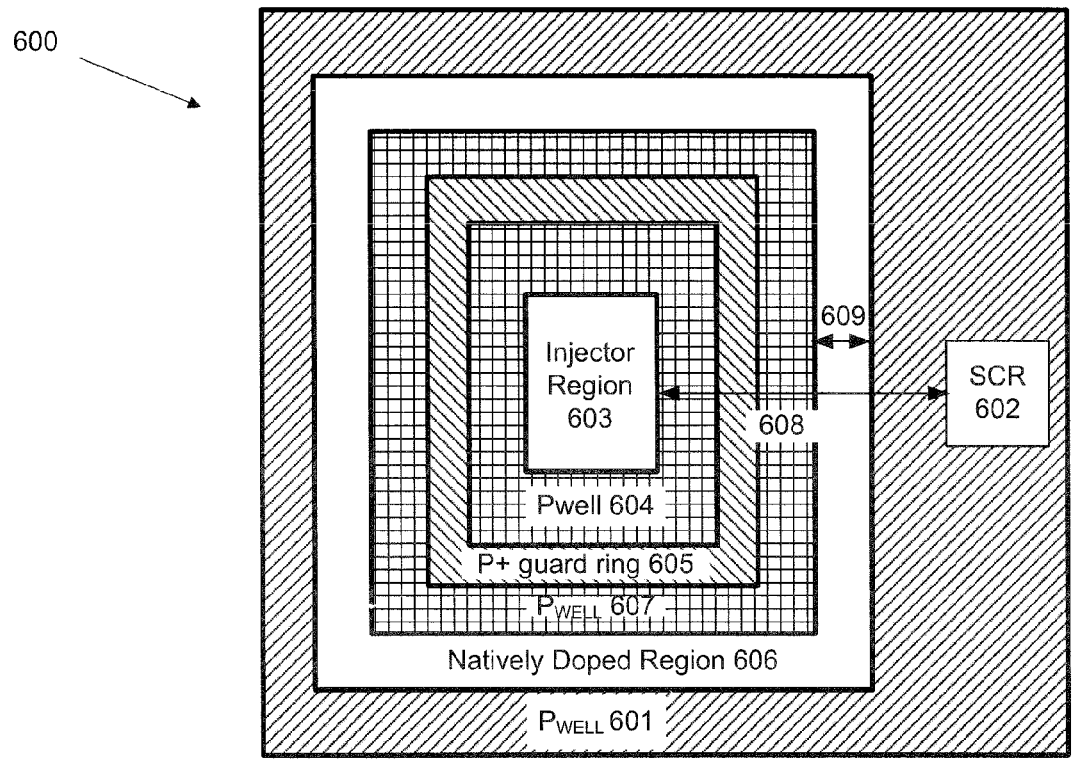
FIG. 6a is a top view of a latch-up prevention device in accordance with another embodiment of the invention.

FIG. 6a is a top view of a latch-up prevention device 600 in accordance with another embodiment of the invention, using the spacing method between the SCR and the injector region. As discussed earlier, a diffusion that is capable of passing stray carriers into the substrate when voltages go out of their normal ranges is called an injector. A parasitic SCR that is near an injector is at risk of entering latch-up. By contrast, a parasitic SCR that is not near an injector has a very low probability of entering latch-up because of the absence of a stray current that causes the necessary voltage drop that activates the SCR. The embodiment shown in FIG. 6a is directed to the method of separating the entire SCR from the injector region using a natively doped region having high resistance.

The latch-up prevention device 600 includes a P-substrate (not shown), a Pwell 601 formed in the P-substrate, an SCR 602, and an injector region 603 comprising at least one diffusion acting as an injector. In the case where the injector is P-type, the injector region 603 typically contains an Nwell (not shown) and can include a well-tie strip or ring (not shown) for the Nwell. The injector region 603 is formed in a Pwell 604. A P+ guard ring 605 is formed in the P-substrate adjacent the Pwell 604. A natively doped region 606 having high resistance is formed in the P-substrate adjacent the P+ guard ring 605. The natively doped region surrounds the injector region 603 and isolates it from the SCR 602. Optionally, P+ guard ring 605 is separated from the natively doped region 606 by the width of Pwell 607 to ensure that the P+ guard ring 605 makes uniform contact with Pwell 604. Pwell 607 can be a separate well electrically connected to Pwell 607, or can be a part of Pwell 604, in which case, P+ guard ring 605 is formed in Pwell 604 at a certain distance from the natively doped region 606.

Figure 6B:
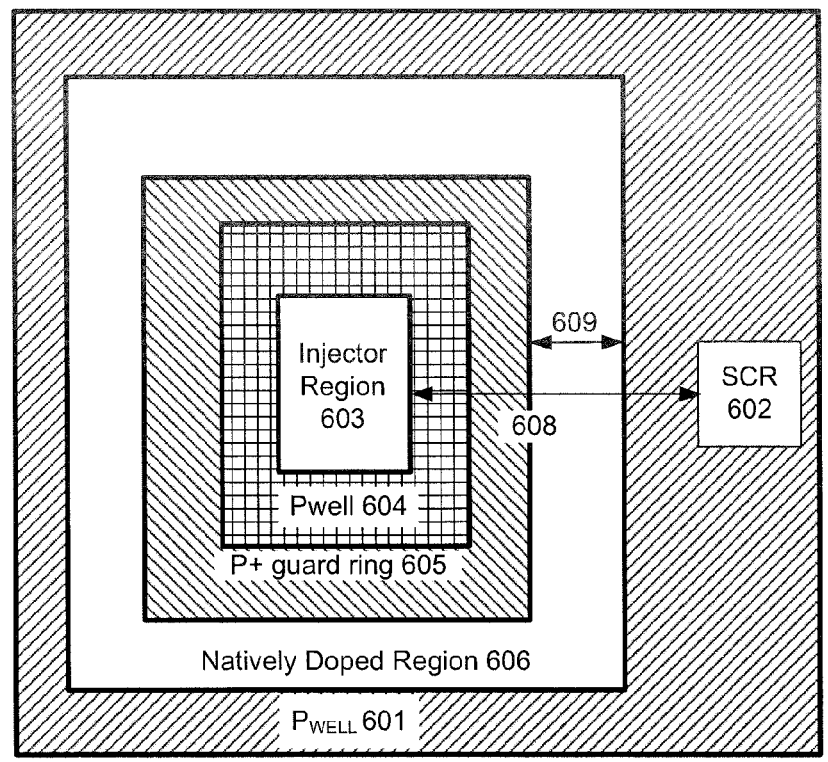

As mentioned above, Pwell 607 is optional and the latch-up prevention device 600 can still function without this Pwell. FIG. 6b is a top view of another embodiment of the latch-up prevention device 600. FIG. 6b shows the P+ guard ring 605 formed adjacent to and in contact with the natively doped region 606. This is in contrast with FIG. 6a which shows P+ guard ring 605 separated from the natively doped region by the width of Pwell 607.

Figure 7:
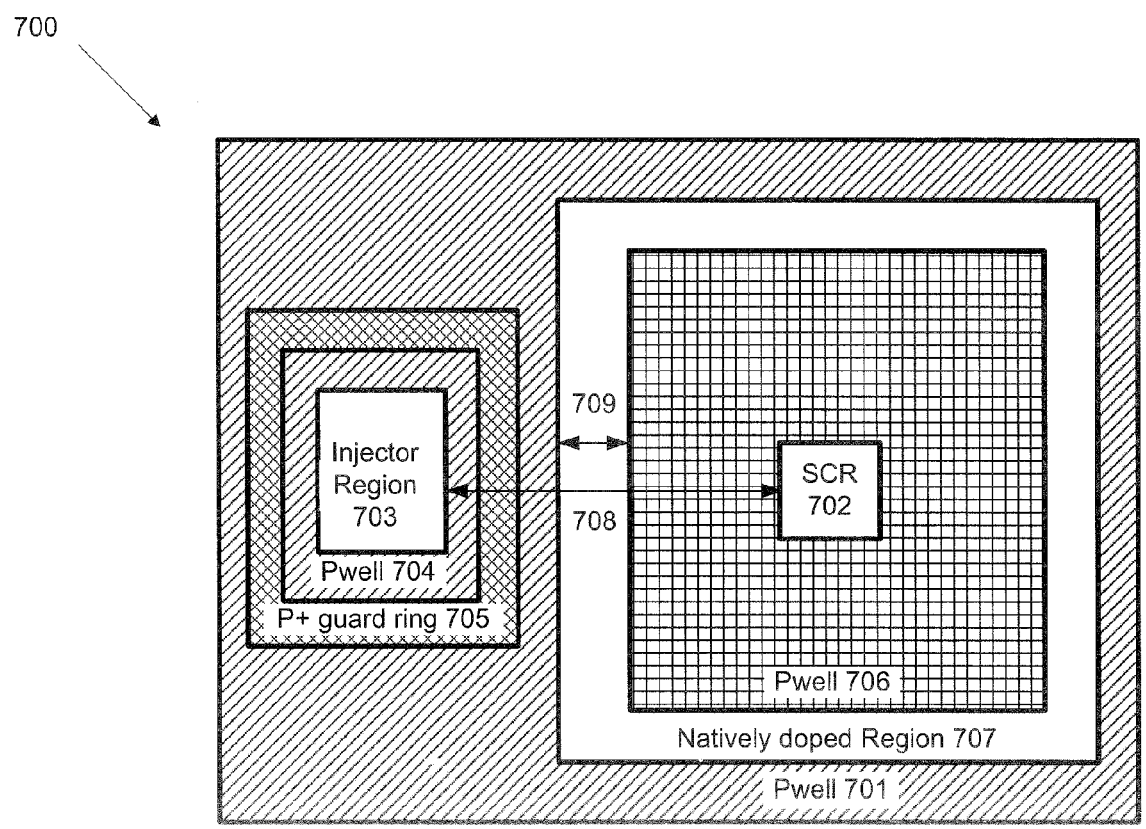

Another embodiment directed to separating the SCR from the injector region is shown in FIG. 7. FIG. 7 is a top view of a latch-up prevention device 700 in which the natively doped region surrounds the SCR instead of surrounding the injector region as in FIGS. 6a and 6b.

The latch-up prevention device 700 includes a P-substrate (not shown), a Pwell 701 formed in the P-substrate, an SCR 702, and an injector region 703 comprising at least one diffusion (not shown) acting as an injector. In the case where the injector is P-type, the injector region 703 typically contains an Nwell (not shown) and possibly a well-tie strip or ring (not shown) for the Nwell. The injector region 703 is formed in a Pwell 704. A P+ guard ring 705 is formed in the Pwell 701 adjacent the injector region 703. The SCR 702 is formed in a Pwell 706. A natively doped region 707 having high resistance is formed in the P-substrate adjacent the Pwell 706. Although Pwell 704 and Pwell 701 are illustrated as separate wells, these wells can be electrically connected with each other so as to form one well, or one terminal.

In the embodiments shown in FIGS. 6a to 7, the natively doped region is used in addition to or instead of the well spacing used in the prior art. The use of the natively doped region allows the space (608 in FIGS. 6a and 6b and 708 in FIG. 7) between the SCR and the injector region to be reduced compared to what would have been required without the natively doped region. Depending on the resistance ratio between the natively doped region and the wells, the area of the natively doped region can achieve the separation resistance required in a much smaller space.

Figure 8A:
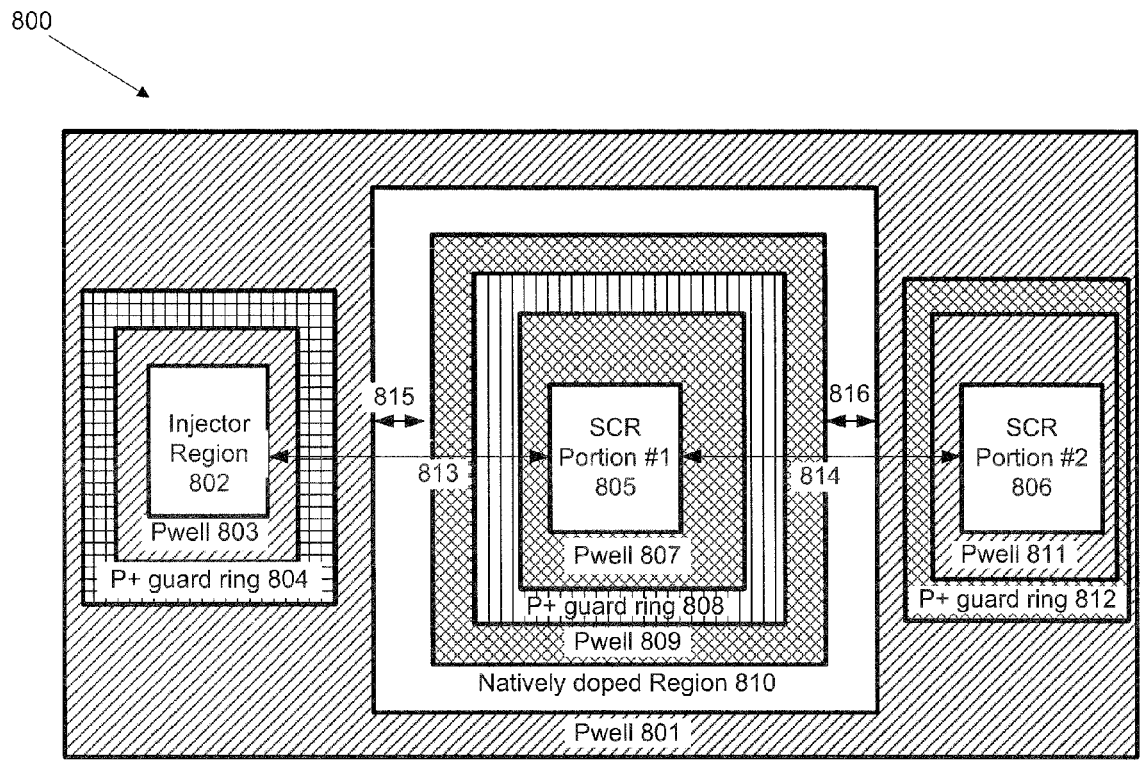
FIG. 8a is a top view of a latch-up prevention device, in which, the natively doped region separates the injector region from the SCR and divides the SCR in two portions.
Figure 8B:
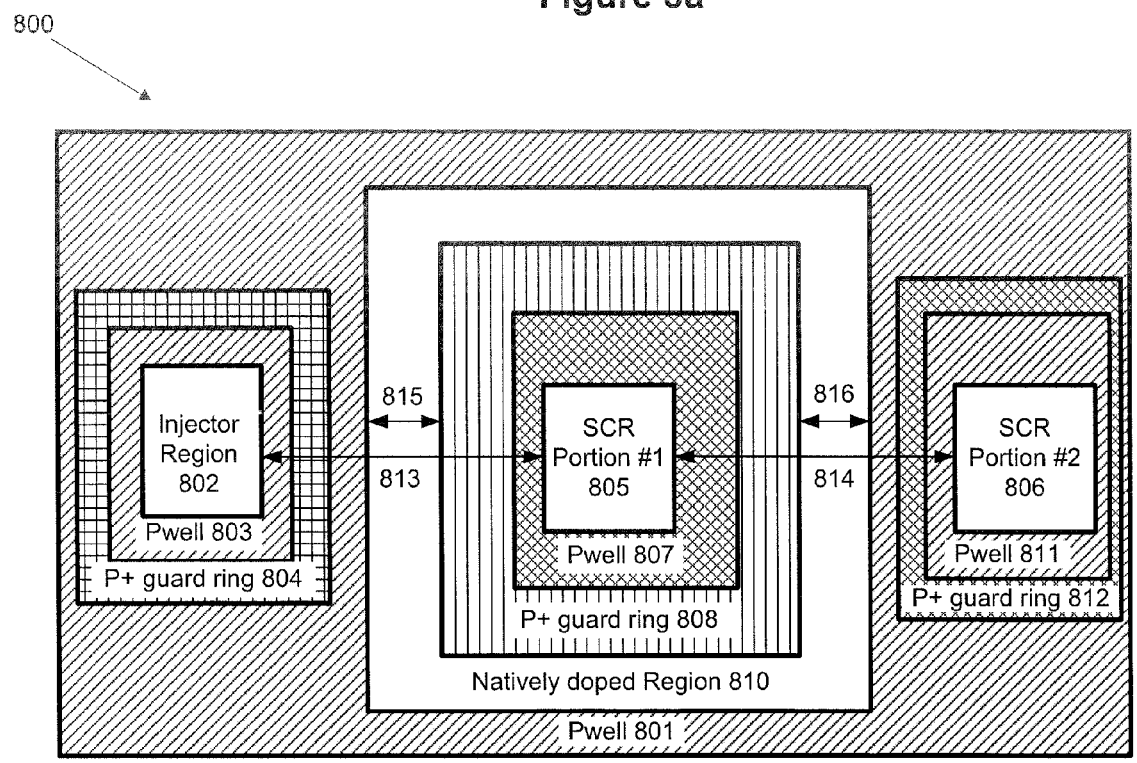

A further embodiment directed to separating the SCR from the injector region is shown in FIGS. 8a and 8b. As explained above, the SCR is formed of two portions connected to each other: an NPN and a PNP. FIG. 8a is a top view of a latch-up prevention device 800, in which the natively doped region separates the injector region from the SCR and divides the SCR in two portions at the same time. One of the portions of the SCR may include at least a P+ diffusion (not shown) in an Nwell (not shown) where the P+ diffusion is connected to a positive supply voltage by a low impedance connection. The other portion can include at least an N+ diffusion (not shown) in a Pwell (not shown) where the N+ diffusion is connected to the lowest voltage node (usually the substrate reference voltage).

The latch-up prevention device 800 includes a P-substrate (not shown), a Pwell 801 formed in the P-substrate, an injector region 802, a Pwell 803 adjacent the injector region 802, a P+ guard ring 804 adjacent the Pwell 803, a first portion of the SCR 805 and a second portion 806. In the case where the injector is P-type, the injector region will typically also contain an Nwell (not shown) and possibly a well-tie strip or ring (not shown) for the Nwell. The first portion 805 is formed in Pwell 807. A P+ guard ring 808 is formed adjacent the Pwell 807. An optional Pwell 809 is formed adjacent the P+ guard ring 808 to ensure that the guard ring 808 makes uniform contact with Pwell 807. Pwell 809 can either be a separate well that is electrically connected to Pwell 807, or can be a part of Pwell 807, in which case the P+ guard ring 808 is formed in Pwell 807 at certain distances from the edges of Pwell 807. A natively doped region 810 having high resistance is formed in the P-substrate adjacent the Pwell 809.

A Pwell 811 is formed in the substrate adjacent the second portion of the SCR 806. A P+ guard ring 812 is formed adjacent the Pwell 811. The natively doped region 810 surrounds the first portion 805 of the SCR and separates the latter from the second portion 806 and from the injector region 802 at the same time, as illustrated in FIG. 8a.

Although Pwells 801, 803, and 811 are illustrated as separate wells, these wells can be electrically connected with each other so as to form one well or one terminal.

As mentioned above, Pwell 809 is optional and the latch-up prevention device 800 can still function without this Pwell. FIG. 8b is a top view of another embodiment of the latch-up prevention device 800. FIG. 8b shows the P+ guard ring 808 formed adjacent to and in contact with the natively doped region 810. This is in contrast with FIG. 8a which shows P+ guard ring 808 separated from the natively doped region by the width of Pwell 809.

According to the embodiment of FIGS. 8a and 8b, the portion of the SCR that is surrounded by the natively doped region is located in between the injector region and the second portion of the SCR that is not surrounded by the natively doped region. The embodiment of FIGS. 8a and 8b is similar to the first embodiment illustrated in FIG. 5a in that the two portions of the SCR are separated by the natively doped region. This embodiment is also similar to the embodiments illustrated in FIGS. 6a to 7 in that the SCR is separated from the injector by the natively doped region having high resistance.

Similar to the embodiments of FIGS. 6a to 7, the natively doped region 810 can be used in addition to or instead of the well spacing used in the prior art. The use of the natively doped region 810 allows the space 813 between the first portion 805 of the SCR and the injector region 802, and the space 814 between the first portion 805 of the SCR and the second portion 806 to be reduced compared to what would have been required without the natively doped region 810.

It is important to note that, for the embodiments shown in FIGS. 6a to 8b, the natively doped region does not block the current. Instead, the natively doped region is simply used to increase the percentage of the current to be absorbed by the guard bands/rings. In order for the efficiency of a guard band/ring to be increased, the band/ring must be placed between the natively doped region and the source of the injection current as shown in FIGS. 6a to 8b.

Furthermore, although complete rings are illustrated in these embodiments, it is possible to achieve the same effect with partial rings or sufficiently long strips. For instance, although the natively doped regions of FIGS. 6a to 8b surround the injector regions and/or the SCR, it is possible to use partial rings of the natively doped region around the areas that need to be isolated, or strips that are sufficiently long with regard to the sizes of the injector region and the SCR. In an embodiment of the invention, the natively doped region can be provided in any shape as long as it is continuous.

In the case where two wells of the same connectivity type are separated by a natively doped region that does not completely surround any of the two wells, such as when the natively doped region is in the form of one or more strips between the two wells, the two wells will be electrically connected with each other and are considered as one well. For example, in the embodiment of FIG. 6a, if the natively doped region is in form of a strip between SCR 602 and the injector region 603, then Pwells 601 and 607 are electrically connected to each other and considered as one well.

Calculation of the impedance value of a substrate or a well can be a difficult operation that depends on the three dimensional shape of the substrate or well and the conformity of doping throughout the substrate. The irregularity in the real shape of the substrate is also an additional factor that limits the preciseness of the measurement. However, the resistance of the natively doped substrate is at least about 10 times higher than the resistance of the wells, and thus requires less space to achieve a certain resistance value. In an embodiment, the ratio of resistance of the natively doped region to the wells can be from about 10 times to about 100 times higher. In a further embodiment, the ratio can be at least about 100 times higher.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention.

For instance, the embodiments shown in FIGS. 5a to 8b and the preceding description illustrate the substrate and wells as being P doped regions, however the invention is not limited to only one type of doping. Someone of skill in the art would appreciate that the invention can still be practiced with N doped substrates and wells, without departing from the scope of the invention as defined in the appended claims. If the substrate is N-type, then the terminals of FIGS. 5a to 5e that are connected to the positive power rail will be connected to the negative power rail, and vice versa.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A semiconductor latch up prevention device comprising:
a substrate;
first and second wells formed in the substrate;
an injector region formed in the first well, the injector region including at least one injector;
a Silicon Controlled Rectifier (SCR) formed in the second well, the SCR including at least first and second parasitic bipolar transistors dominantly of opposite connectivity types;
a natively doped region provided between the SCR and the injector region, the natively doped region having a resistance at least about 10 times higher than a resistance of the first and second wells; and
a guard ring formed in the first well between the injector region and the natively doped region;
the substrate, the first and second wells, and the natively doped region being of the same connectivity type, and the substrate and the natively doped region having substantially the same doping.

2. The device of claim 1, wherein the natively doped region is an epitaxial layer.

3. The device of claim 1, wherein the natively doped region is provided in the form of one or more strips, and wherein the first well and the second well are electrically connected to each other and form one well.

4. The device of claim 1, wherein the resistance of the natively doped region is in the range of about 10 to about 100 times higher than the resistance of the first well.

5. The device of claim 1, wherein the resistance of the natively doped region is more than 100 times higher than the resistance of the first well.

6. The device of claim 1, wherein the natively doped region surrounds the injector region, the first well, and the guard ring.

7. The device of claim 1, wherein the natively doped region surrounds the second well and the SCR.

8. The device of claim 1, wherein the connectivity type of the substrate, the wells and the natively doped region is P-type.

9. The device of claim 1, wherein the connectivity type of the substrate, the wells and the natively doped region is N-type.

10. The device of claim 6, further comprising a third well of the same connectivity type, the third well being electrically connected to the first well, and being provided between the guard ring and the natively doped region.

11. A semiconductor latch up prevention device comprising:
a substrate;
first and second wells formed in the substrate;
an injector region formed in the first well, the injector region including at least one injector;
a first guard ring provided in the first well adjacent the injector region;
a first parasitic bipolar transistor formed in the second well, the first parasitic bipolar transistor being dominantly of the first connectivity type;
a second guard ring formed in the second well adjacent the first parasitic bipolar transistor;
a natively doped region provided between the second guard rind and the first well, the natively doped region having a resistance at least about 10 times higher than a resistance of the first and second wells;
a second parasitic bipolar transistor formed in the first well, the second parasitic bipolar transistor being dominantly of a second connectivity type so as to form a Silicon Controlled Rectifier (SCR) with the first parasitic bipolar transistor;
a third guard ring formed in the first well between the natively doped region and the second parasitic bipolar transistor;
the substrate, the first and second wells, and the natively doped region being of the same connectivity type, and the substrate and the natively doped region having substantially the same doping;
wherein the first parasitic bipolar transistor is provided in between the second parasitic bipolar transistor and the injector region, and wherein the natively doped region surrounds the first parasitic bipolar transistor, the second well and the second guard ring so as to concurrently isolate the first parasitic bipolar transistor, the second well and the second guard ring from the second parasitic bipolar transistor and from the injector region.

12. The device of claim 11, further comprising a third well of the same connectivity type as the second well, that is electrically connected to the second well, and is provided between the second guard ring and the natively doped region.

13. The device of claim 11, wherein the first parasitic bipolar transistor is dominantly P-type and the second parasitic bipolar transistor is dominantly N-type.

14. The device of claim 11, wherein the first parasitic bipolar transistor is dominantly N-type and the second parasitic bipolar transistor is dominantly P-type.

15. The device of claim 11, wherein the natively doped region is an epitaxial layer.

16. The device of claim 11, wherein the natively doped region is provided in the form of one or more strips and wherein the first well and the second well are electrically connected to each other and form one well.

17. The device of claim 11, wherein the resistance of the natively doped region is in the range of about 10 to about 100 times higher than the resistance of the first well.

18. The device of claim 11, wherein the resistance of the natively doped region is more than 100 times higher than the resistance of the first well.

19. The device of claim 11, wherein the connectivity type of the substrate, the wells and the natively doped region is P-type.

20. The device of claim 11, wherein the connectivity type of the substrate, the wells and the natively doped region is N-type.

21. A semiconductor latch up prevention device comprising:
   a substrate of a first connectivity type;
   a first well of a second connectivity type formed in the substrate, the first well including at least a first implanted region of the first connectivity type and a second implanted region of the second connectivity type, the implanted regions of the first well being arranged for connection to first polarity rail;
   a second well of the first connectivity type formed in the substrate including a third implanted region of the first connectivity type;
   a third well of the first connectivity type formed in the substrate, the third well including at least a fourth implanted region of the first connectivity type and a fifth implanted region of the second connectivity type, the second and third wells being electrically connected to the substrate and forming one terminal therewith; and
   a natively doped region provided between the second and third wells, the natively doped region having a resistance at least about 10 times higher than the second and third wells, the implanted regions of the second and third wells being arranged for connection to a second polarity rail;
   the first implanted region forming a first parasitic bipolar transistor dominantly of the first connectivity type with the first well and the second well, and the fifth implanted region forming a second parasitic bipolar transistor dominantly of the second connectivity type with the first well and the third well, wherein the natively doped region creates a separation resistance that helps the current received upon activation of the first parasitic bipolar transistor to flow through the third implanted region of the second well away from the second parasitic bipolar transistor in order to avoid latch up.

22. The device of claim 21, wherein the first well comprises a sixth implanted region of the first connectivity type for connection to a circuit pad.

23. The device of claim 21, wherein the third well comprises a seventh implanted region of the second connectivity type for connection to a circuit pad.

24. The device of claim 21, wherein the first and fifth implanted regions are diffusions.

25. The device of claim 21, wherein the third and the fourth implanted regions are guard rings.

26. The device of claim 21, wherein the natively doped region is an epitaxial layer.

27. The device of claim 21, wherein the natively doped region is provided in the form of one or more strips and wherein the second well and the third well are electrically connected to each other and form one well.

28. The device of claim 21, wherein the natively doped region is provided in the form of a ring that surrounds the first and the second wells.

29. The device of claim 21, wherein the natively doped region is provided in the form of a ring that surrounds the third well.

30. The device of claim 21, wherein the natively doped region is provided in the form of two rings, one ring that surrounds the first and second wells, and one ring that surrounds the third well.

31. The device of claim 21, wherein the resistance of the natively doped region is in the range of about 10 to about 100 times higher than the resistance of the second and third wells.

32. The device of claim 21, wherein the resistance of the natively doped region is more than 100 times higher than the resistance of the second and third wells.

33. The device of claim 21, wherein the first connectivity type is P-type and the second connectivity type is N-type.

34. The device of claim 21, wherein the first connectivity type is N-type and the second connectivity type is P-type.

35. The device of claim 33, wherein the first polarity rail is a positive power rail, and the second polarity rail is a negative power rail.

36. The device of claim 34, wherein the first polarity rail is a negative power rail, and the second polarity rail is a positive power rail.

* * * * *